(12) United States Patent
Fujii et al.

(10) Patent No.: US 6,442,443 B1
(45) Date of Patent: Aug. 27, 2002

(54) INFORMATION PROCESSING APPARATUS AND POWER SAVING APPARATUS

(75) Inventors: Kazuo Fujii, Yokohama; Takeshi Asami, Yamato; Yukifumi Nakazawa, Ebina, all of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/118,194

(22) Filed: Jul. 17, 1998

(30) Foreign Application Priority Data

Jul. 17, 1997 (JP) .............................................. 9-192801

(51) Int. Cl.$^7$ .............................................. G06F 17/00
(52) U.S. Cl. ........................ 700/94; 380/120; 330/149; 713/324
(58) Field of Search ........................... 700/94; 381/120, 381/121; 713/300, 324; 330/149, 51

(56) References Cited

U.S. PATENT DOCUMENTS

| 5,818,299 A | * | 10/1998 | Tran ........................... 330/149 |
| 5,822,598 A | * | 10/1998 | Lam ............................ 713/324 |
| 6,041,416 A | * | 3/2000 | Lada, Jr. ..................... 713/300 |

FOREIGN PATENT DOCUMENTS

| JP | 9107253 | 4/1977 | |
| JP | 5324139 | 12/1993 | ............. G06F/1/00 |

OTHER PUBLICATIONS

Patent Abstracts of Japan, Publication No. 09107253, date of Publication on appliation: Apr. 22, 1997.

* cited by examiner

*Primary Examiner*—Ping Lee
(74) *Attorney, Agent, or Firm*—J. Bruce Schelkopf; Andew J. Dillon

(57) ABSTRACT

An improved information processing apparatus, which accomplishes power-saving of an audio amplifier depending on the activity of each peripheral device having an audio signal output. This information processing apparatus includes one or more peripheral devices, each having an audio signal output and a mute signal output, the mute signal output indicating a mute state in which the targeted peripheral device does not output an audio signal, an audio amplifier for receiving the audio signal from each of the one or more peripheral device, a speaker for generating an audible output in accordance with an output of said audio amplifier; and an AND gate for receiving the mute signal from each of the one or more peripheral devices to perform a logical AND operation of the mute signals, the AND gate outputting a control signal for disabling the audio amplifier when all of the mute signals indicate the mute state. Thus, it is determined whether or not each of the peripheral devices for outputting an audio signal stays at the mute state, and the audio amplifier is disabled only when all of these peripheral devices are at the mute state.

12 Claims, 2 Drawing Sheets

[Figure 1]
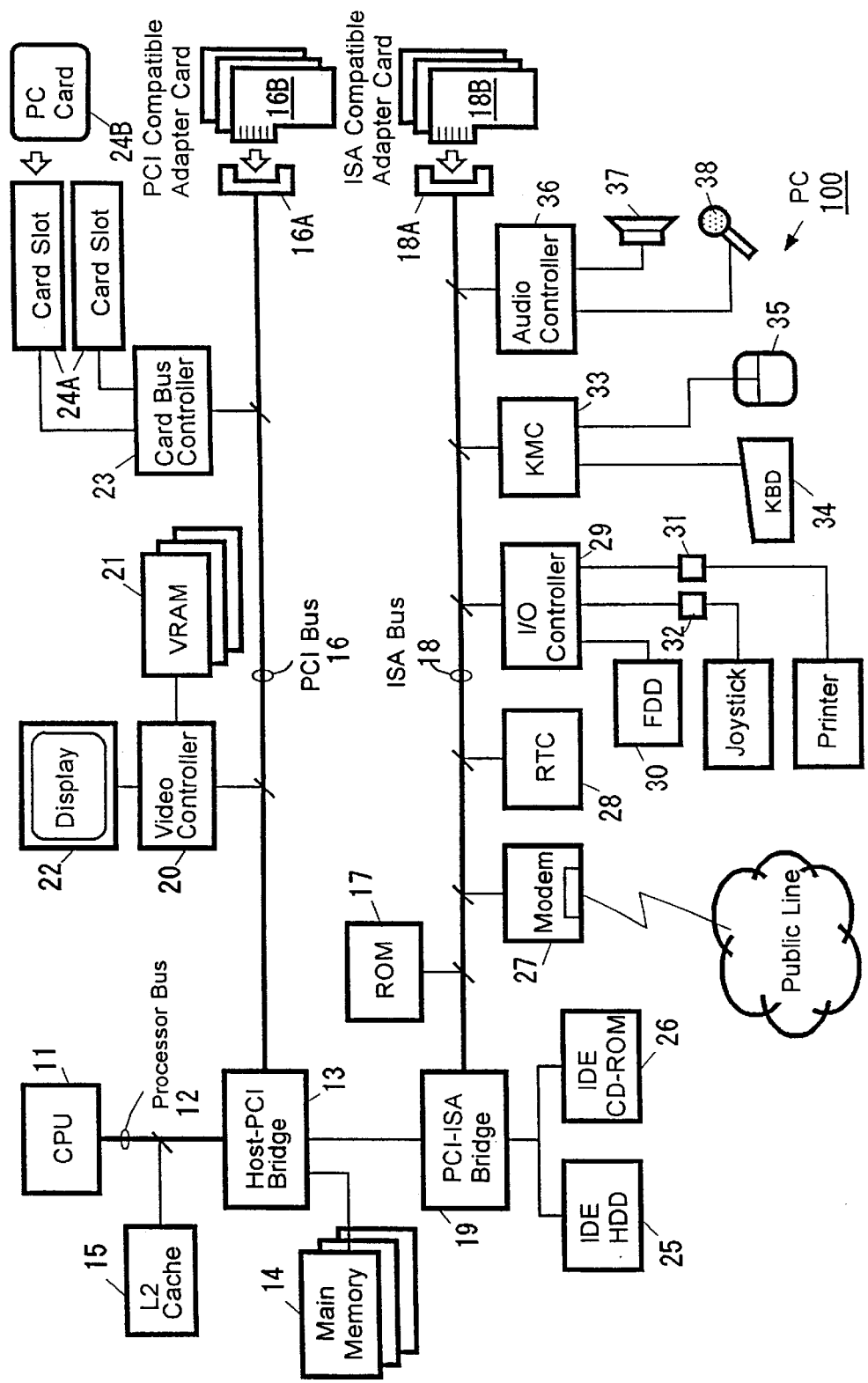

[Figure 2]
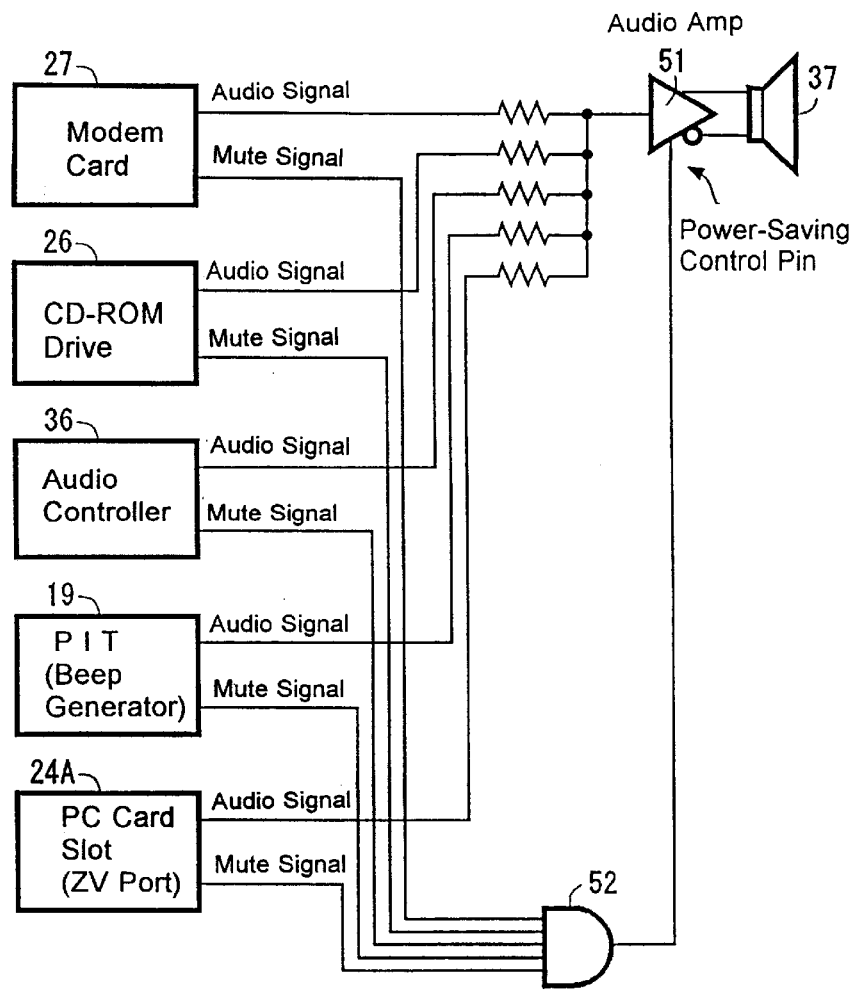
[Figure 3]
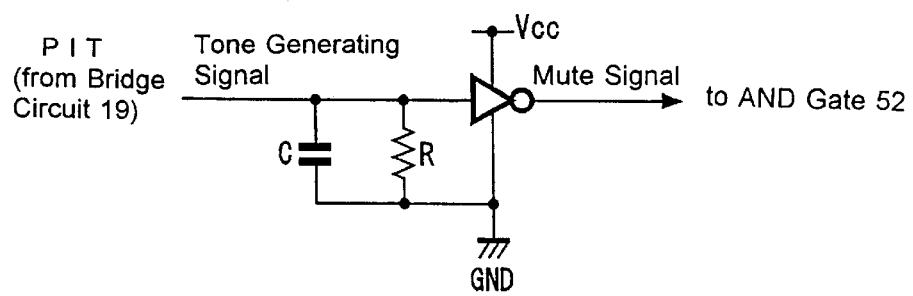

INFORMATION PROCESSING APPARATUS AND POWER SAVING APPARATUS

FIELD OF THE INVENTION

This invention relates to an information processing apparatus, including but not limited to, a notebook PC (personal computer) and, more particularly, to an information processing apparatus of the type which has a plurality of peripheral devices for outputting audio signals, and provides an audio output by an audio amplifier and a speaker. More specifically, this invention relates to an information processing apparatus that is designed to implement a power-saving function for an audio amplifier in accordance with an unused state of each peripheral device for outputting an audio signal.

BACKGROUND ART

With the technological revolution, different types of PCS, such as desktop type, tower type and notebook type, have been developed and are commercially available in the marketplace. Of these PCS, a notebook PC has been designed and manufactured to have a smaller size and be of a lighter weight, thereby to improve its mobility/portability and adaptability for outdoor use.

One of the features of a notebook PC resides in that it may be driven by a battery provided internally to its system unit. This is because it has been designed on an assumption that a commercial power supply is not normally available under a mobile environment. In general, a battery used by a notebook PC is in the form of a "battery pack", which comprises a plurality of rechargeable battery cells of Li-Ion, NiCd, NiMH or the like. While such a battery pack is said to be reusable through the process of charging, nevertheless it takes 2 to 3 hours to charge it up to its full capacity, even, though such a full capacity is durable for 2 to 3 hours at most, in terms of computer processing time. Accordingly, for the purpose of extending an operable duration of a battery, a variety of ideas for power-saving have been proposed in the past. Thus, a positive introduction of a power-saving function is generally regarded as another feature of a notebook PC.

Also, even for a desktop type PC driven by a commercial power supply, there has been an increased demand for power-saving from an ecological standpoint. In this respect, the Environmental Protection Agency in the U.S.A. in June 1993 has announced voluntary constraints, called "Energy Star Computer Program",and requested that power consumption of a computer during its standby state be less than a predetermined level (e.g., driving power of 30 W, or 30% of nominal power consumption, when a CPU is fully operating). Accordingly, respective computer makers have competitively developed and manufactured desktop PC products following this voluntary program.

A very basic point of power-saving designs for a variety of electric/electronic apparatuses, including PCS, is to stop power feeding to a device or circuit that is not currently in use. For example, U.S. Pat. No. 4,933,785 discloses a technique adapted for use in a hard disk drive (HDD) such that power feeding to its internal electric circuits is sequentially stopped in accordance with an operational status of the drive (i.e., the elapsed time from the last access to a disk), as set forth in claim 45 of the U.S. Pat. No. 4,933,785.

PCS are now incorporating a rapidly expanded multimedia function (i.e., the function for handling various data elements, which includes motion pictures, still pictures, sounds and characters, in addition to conventional computer data, on a computer system in a composite or integrated manner). This function has a variety of applications, ranging from execution of software recorded on a CD-ROM (compact disk) to communication/broadcasting fields such as a TV conference and a color facsimile. In connection with this, a certain type of peripheral device having audio signal outputs (e.g., a CD-ROM drive, a modem and an audio CODEC) has been installed onto a PC's system unit as its standard or optional feature. Also, as a result of an attempt to define an industrial standard, there has appeared a ZV (Zoom Video) port that is compatible with a PC card slot. A ZV port compatible PC card implements a fast motion picture display by directly transferring data to/from a video controller, and it has inputs/outputs for video and audio signals respectively. In other words, an audio function is now regarded as an essential feature of a multimedia PC, and it may be accomplished by acoustically outputting an audio signal from each peripheral device through an audio amplifier, a technique which is well known in the art.

With regard to the power-saving designs, as described above, the very basic point of the power-saving designs is to stop power feeding to a circuit module that is currently in an unused state. However, no substantial attempt has been ever made in the field of PCS to provide a power-saving design for an audio amplifier. This is primarily because it has been difficult to precisely detect an unused state of an audio amplifier since a certain number of peripheral devices (e.g., a CD-ROM drive, an audio CODEC and a modem) are involved, each outputting an audio signal.

Many of the audio amplifiers for use in portable type equipment are configured to have power control pins (power-saving pins) that may be used for controlling an ON/OFF state in response to inputs applied to these pins. However, notwithstanding the provision of such pins, the respective audio amplifier has been normally maintained in an ON state, thereby to continually consume electric power at a certain level on a motherboard of a PC. While an audio amplifier consumes about 100 mW of electric power, this level of power consumption is not negligible for a battery-driven PC.

SUMMARY OF THE INVENTION

It is, therefore, an object of this invention to provide an improved information processing apparatus, which incorporates a power-saving design. It is another object of this invention to provide an improved information processing apparatus, which accomplishes power-saving in accordance with an Unused state of a peripheral device. It is yet another object of this invention to provide an improved information processing apparatus, which accomplishes power-saving of an audio amplifier in accordance with an activity of each peripheral device having an audio signal output.

This invention has been made in view of the stated problems and its first aspect resides in an information processing apparatus, including: one or more peripheral devices, each having an audio signal output and a mute signal output, the mute signal output indicating a mute state in which the peripheral device does not output an audio signal; an audio amplifier for receiving the audio signal from each of the one or more peripheral devices; a speaker for generating an audible output in accordance with an output of the audio amplifier; and an AND gate for receiving the mute signal from each of the one or more peripheral devices to perform a logical AND operation of the mute signals, the AND gate outputting a control signal for disabling the audio amplifier when all of the mute signals indicate the mute state.

The second aspect of this invention resides in an information processing apparatus, including: one or more peripheral devices, each having an audio signal output; an audio amplifier for receiving the audio signal from each of said one or more peripheral devices; a speaker for generating an audible output in accordance with an output of said audio amplifier; and power saving means for monitoring whether or not each of said one or more peripheral devices stays at a mute state in which the said peripheral device does not output the audio signal, and for switching said audio amplifier to a power-saving state only when all of said one or more peripheral devices stay at the mute state.

The third aspect of this invention resides in a power saving apparatus for an audio amplifier adapted for use in an information processing apparatus of the type, which has one or more peripheral devices each outputting an audio signal, and generates an audible output by said audio amplifier and a speaker, including structure for receiving a mute signal from each of the one or more peripheral devices, the mute signal indicating a mute state in which the peripheral device does not output an audio signal; and device for performing a logical AND operation of the received mute signals, and for outputting a control signal to disable the audio amplifier when all of the mute signals indicate the mute state.

The fourth aspect of this invention resides in a power saving apparatus for an audio amplifier adapted for use in an information processing apparatus of the type, which has one or more peripheral devices each outputting an audio signal, and generates an audible output by the audio amplifier and a speaker, including monitoring device for monitoring whether or not each of said one or more peripheral devices stays at a mute state in which the peripheral device does not output the audio signal; and power saving device for switching the audio amplifier to a power-saving state only when all of the one or more peripheral devices stay at the mute state.

In each aspect of this invention, the peripheral device for outputting an audio signal may include a modem, a CD-ROM drive, an audio controller, a ZV port compatible PCMCIA (Personal Computer Memory Card International Association) card slot, and the like. The modem card 27 enters into a non-mute state during the off-hook operation, which corresponds with the conversational state. Also, when the PCMCIA slot is used as a ZV port, there exists an audio signal output and, thus, the PCMCIA slot enters into a non-mute state.

Therefore, in accordance with an information processing apparatus and a power saving apparatus of this invention, it is determined whether or not each peripheral device for outputting an audio signal stays at the mute state, and the audio amplifier is disabled only when all of these peripheral devices stay at the mute state. In other words, it becomes possible to precisely detect an unused state of the audio amplifier, whereby its power consumption may be definitely reduced in such an unused state.

The foregoing and other objects, features and advantages of this invention will be apparent from the following detailed description of an embodiment of this invention, as illustrated in the accompanying drawings.

BRIEF DESCRIPTION OF THE DRAWINGS

FIG. 1 is a block diagram showing a hardware configuration of a typical personal computer (PC) adapted for implementing this invention.

FIG. 2 is a diagram showing a power-saving mechanism in a preferred embodiment of this invention.

FIG. 3 is a diagram showing a configuration of a beep detection circuit.

DETAILED DESCRIPTION OF THE PREFERRED EMBODIMENT(S)

Now, with reference to the drawings, an embodiment of this invention will be described in detail. A description of the invention in the specification, including the illustrations, includes the following reference symbols and elements: 11 . . . CPU; 12 . . . processor bus; 13 . . . Host-PCI bridge circuit; 14 . . . main memory; 15 . . . L2-Cache; 16 . . . PCI bus; 16A . . . PCI bus slot; 16B . . . PCI bus compatible bus slot; 17 . . . ROM; 18 . . . ISA bus; 18A . . . ISA bus slot; 18 . . . ISA bus compatible bus slot; 19 . . . PCI-ISA bridge circuit; 20 . . . video controller; 21 . . . VRAM; 22 . . . display; 23 . . . card bus controller; 24A . . . card slot; 24B . . . PC card; 25 . . . HDD; 26 . . . CD-ROM drive; 27 . . . modem. card; 28 . . . RTC; 29 . . . I/O controller; 31 . . . parallel port; 32 . . . serial port; 33 . . . KMC; 34 . . . keyboard; 35 . . . pointing device; 36 . . . audio controller; 37 . . . speaker; 38 . . . microphone; 51 . . . audio amplifier; 51 . . . AND gate; and 100 . . . personal computer.

In FIG. 1, there is schematically shown a hardware configuration of a typical personal computer (PC) 100. An example for implementing this invention is a type of PC, which conforms to the specifications of OADG (PC Open Architecture Developer's Group) and incorporates an operating system (OS) such as "Windows95" of Microsoft Corp. or "OS/2" of IBM Corp. Hereinafter, each component will be described.

CPU 11, acting as a main controller, executes a variety of programs under the control of OS. CPU 11 may be a CPU chip called "Pentium" or "MMX Technology Pentium" made by Intel Corp.

CPU 11 interconnects with each hardware block (to be described) through a hierarchical bus structure.of three levels, which comprises a processor bus 12 directly coupled to its own external pins, a PCI (Peripheral Component Interconnect) bus 16, as a local bus, and an ISA (Industry Standard Architecture) bus 18.

Processor bus 12 and PCI bus 16 are interconnected by a bridge circuit (host-PCI bridge) 13. This bridge circuit 13 comprises a memory controller for controlling access operations to a main memory 14, a data buffer for absorbing a speed difference between both buses 12 and 16.

The main memory 14 is a writable memory used as read-in areas or working areas of executed programs. In general, the main memory 14 comprises a plurality of DRAM (dynamic RAM) chips such that its basic capacity is typically 32 MB and extendable up to 256 MB. The executed programs include an OS such as "Windows95" and a variety of application programs.

L2-cache 15 is a high speed memory for absorbing access time to the main memory 14 and is used for temporarily storing limited code and data to be frequently accessed by CPU 11. In general, L2-cache 15 comprises SRAM (static RAM) chips and its typical capacity is 512 KB.

PCI bus 16 is a type of bus that enables the transfer of data at a relatively high rate (bus width: 32/64 bits, maximum operating frequency: 33/66 MHz, maximum data transfer rate: 132/264 MBps), and is used for connecting relatively fast PCI devices such as a video controller 20 and a card bus controller 23. As well known in the art, the PCI architecture is based on the proposal of Intel Corp. and implements the so-called "PnP" (Plug and Play) function.

The video controller 20 is a dedicated controller for actually processing drawing instructions from CPU 11. In operation, it temporarily stores the processed drawing information into a screen buffer (VRAM) 21, reads the drawing information from VRAM 21 and provides the same as a video output to a liquid crystal display (LCD) or a CRT display 22.

The card bus controller 23 is a dedicated controller for directly coupling those bus signals on PCI bus 16 to a PC card slot 24A (card bus). Insertable into this PC card slot 24A is a PC card 24B, which conforms to the industry standard (e.g., "PC Card Standard 95") defined by PCMCIA/JEIDA (Japan Electronic Industry Development Association). In the group of types of PC card 24B, there is a LAN card, an HDD internal card, a PC card that is compatible with a ZV port, and the like. Of these PC cards, a ZV port compatible PC card implements a fast motion picture display by means of directly transferring data to and from the video controller 20, as described above. A PCMCIA connector, which is not illustrated, as being outside the scope of this invention, is provided on a bottom surface of the PC card slot 24A has 68 pins. One of these pins is defined as an identification pin for indicating whether the card being inserted into the PC card slot 24A is a conventional PC card or a ZV port compatible PC card. If a ZV port compatible PC card is not inserted into the PC card slot 24A, there will be no audio signal output from this PC card and, thus, the PC card slot 24A will be put in a mute state.

PCI bus 16 and ISA bus 18 are interconnected by a bridge circuit (PCI-ISA bridge) 19. This bridge circuit 19 includes a DMA controller, a programmable interrupt controller (PIC) and a programmable interval timer (PIT). DMA controller is a dedicated controller for executing a data transfer between a peripheral device and main memory 14 without an intervention of CPU 11. PIC is a dedicated controller that is responsive to an interruption request (IRQ) from a peripheral device for causing a predetermined processing program to be executed. PIT is an apparatus for generating timer signals at predetermined frequencies. The timer signals generated by this PIT are programmable and they include an interruption signal periodically provided to OS/BIOS (to be described) at an interval of 55 msec, a DRAM refreshing timer signal that is switched between low/high levels at an interval of 15.2 sec, a tone generating signal for generating a beep, and the like.

Also, the bridge circuit 19 is provided with an IDE interface for connecting external storage devices, which conform to the IDE (Integrated Drive Electronics). To this IDE interface, an IDE hard disk drive (HDD) 25 and an IDE CD-ROM drive 26 may be connected. HDD 25 is desirable over another external storage device in terms of its access rate. Accordingly, by copying software programs (e.g., OS, applications) onto disks of HDD 25 (i.e., by "installing" them onto the system 100), these programs are ready for use by the system 100. CD-ROM drive 26 is capable of reproducing a music CD (CD-DA data), or reading computer data (CD-ROM data) for installing software programs provided in the form of a CD-ROM onto the system 100. Except for a case of reproducing music data, CD-ROM drive 26 is put in a mute state.

ISA bus 18 has a slower data transfer rate than PCI bus 16 (bus width: 16 bits, maximum data transfer rate: 4 Mbps) and, thus, it is used for connecting relatively slower peripheral devices such as a ROM 17, a modem card 27, a real time clock (RTC) 28, an I/O controller 29, a keyboard/mouse controller (KMC) 33 and an audio controller 36.

ROM 17 is a non-volatile memory, which permanently stores code groups (BIOS: Basic Input/Output System) for controlling I/O operations of respective hardware components such as a keyboard 34 and a floppy disk drive (FDD) 30, in addition to a POST (Power On Self Test) program.

The modem card 27 is a device for transmitting computer data in a digital form via a public switched telephone network (PSTN) of an analog type. It includes a signal processing circuit (modem chip) for modulating transmission data and for demodulating received data, as well as other circuit components such as a data access arrangement (DAA) circuit for connecting the modem to a public switched telephone network in accordance with the line switching standards for each country. The modem card 27 is in a non-mute state during the off-hook state (i.e., during the conversational state), whereas it is in a mute state during the on-hook state.

RTC 28 is a device for measuring the current time-of-day. In general, RTC 28 is mounted on a single chip with a CMOS memory (not shown). Typically, this CMOS memory is used for temporarily storing critical information to the security and safety of the system 100 such as system configuration information and a power-on password. RTC/CMOS 28 is backed up by a reserve battery (normally a coin battery) so that the measured/stored contents are not lost even after the system 100 goes to its power-off state.

I/O controller 29 is a peripheral controller for controlling operations of FDD 30, I/O operations of parallel data (PIO) via a parallel port 31, and I/O operations of serial data (SIO) via a serial port 32. A printer may be connected to the parallel port 31, whereas a joystick may be connected to the serial port 32.

KMC 33 is a dedicated controller for capturing input scan codes from the keyboard 34, or input coordinate values as computer data, from a pointing device (e.g., a mouse or a tracking pointer, as offered by IBM Corporation) 35.

The audio controller 36 is a dedicated controller for performing I/O processing of audio signals, which comprises capturing of an audio signal inputted from a microphone 38 as computer data, and outputting of an audio signal from a speaker 37 after performing a DA conversion. This audio controller 36 includes an audio CODEC for encoding/decoding audio signals, and an audio amplifier for amplifying audio signals.

At one end of the buses 16 and 18, one or more PCI bus slots 16A and one or more ISA bus slots 18A may be provided respectively. These bus slots 16A and 18A may be exposed externally from a portion of a side surface of the system 100. Alternatively, these bus slots 16A and 18A may be provided by a docking station for a notebook PC (not shown), although no further detail thereof will be given herein. To these bus slots 16A and 18A, a PCI compatible adapter card 16B and an ISA compatible adapter card 18B may be mounted respectively.

Those personal computers commercially available in the marketplace will sufficiently function as the computer system 100 shown in FIG. 1. It is apparent to those of ordinary skill in the art that additional electronic circuits or the like other than those shown in FIG. 1 are required to construct the computer system 100. However, these components are not described in the present specification, since they are well known in the art and are not necessary to the understanding of this invention. Also, it should be noted that for clarity and simplicity of the drawings, only a portion of the connections between the illustrated hardware blocks is shown in FIG. 1.

In FIG. 2, there is shown a power-saving mechanism in the present embodiment. It should be understood that this power-saving mechanism is incorporated into the hardware shown in FIG. 1. As described above and shown in FIG. 2, the system 100 is provided with 5 different peripheral devices each having an audio signal output, which comprises a modem card 27, a CD-ROM drive 26, an audio controller 36, a bridge circuit 19 and a PC card slot 24A, with the understanding that a ZV port compatible PC card is inserted therein.

An audio signal from each of these peripheral devices is applied to an audio amplifier 51, amplified by the same, and then outputted as an audible sound from a speaker 37.

Also, each of these peripheral devices has a mute signal output respectively for indicating a mute state, in which the said peripheral device does not output an audio signal by itself. These mute signals are applied to an AND gate 52. Since this AND gate 52 is arranged to perform a logical AND operation of these mute signals, its asserted output indicates that all of these peripheral devices are in a mute state, i.e., the audio amplifier 51 is in a completely unused state. As shown in FIG. 2, an output signal of this AND gate 52 is applied to a power-saving control pin of the audio amplifier 51.

When an input to the power-savi ng control pin is in a negate state, the audio amplifier 51 is put in a normal mode. During this normal mode, power is fed to the audio amplifier 51 and, thus, it is enabled to receive an audio signal output from each of the peripheral devices and to amplify the same. On the other hand, when an input to the power-saving control pin is in an asserted state, the audio amplifier 51 is entered into a power-saving state, thereby to reduce its power consumption along with disabled amplification of an audio signal. Thus, according to the present embodiment, it is possible to precisely detect an unused state of the amplifier 51, whereby its power consumption may be definitely reduced in such an unused state.

In general, the modem card 27 does not have a mute signal output. In such a case, however, an off-hook signal of the modem card 27 may be substituted for a mute signal.

As for the CD-ROM drive 26, it is ordinary that an audio circuit within the drive unit has a mute output. Accordingly, it is possible to obtain a mute signal by deriving the internal mute signal toward the system 100 via an interface connector (e.g., an IDE interface connector in case of the present embodiment).

Also, with respect to the audio controller 36, an unused general-purpose output pin may be defined as a mute signal. Such an action may be relatively easily implemented under control of a device driver for the audio controller 36. Also, with respect to the bridge circuit 19, it is possible to detect an output of a tone generating signal from the internal PIT and to substitute this detected signal for a mute signal.

In FIG. 3, there is shown a configuration of a "beep detection circuit" for detecting an output of the tone generating signal. As well known in the art, the tone generating signal itself is a set of successive rectangular waves. The beep detection circuit includes an integrator, including a capacitor [©] (C) and a resistor (R) connected in parallel to each other, and an inverter for providing an inverted output. Thus, when there is the tone generating signal applied to this beep detection circuit, its output is negated to indicate a non-mute state. Conversely, when there is no such tone generating signal, its output is asserted to indicate a mute state.

Further, the PC card slot 24A itself does not have a mute signal (i.e., of the 68 pins in its PCMCIA connector, there is no signal pin specifically assigned to a mute signal).

However, other than a case where a ZV port compatible PC card is inserted into the PC card slot 24A, there is no audio signal output from this PC card and, thus, the identification pin for indicating insertion of a ZV port compatible PC card may be substituted for a mute signal. For example, in the PC card controller chip "PC 11250" commercially available from Texas Instruments company, 2 bits appearing on its external pins of the bit numbers 7 and 6 are used for indicating an attribute of a card inserted. That is, a bit value of "00" represented by the 2 bit pins indicates an-activity as a PC card socket, whereas another bit value of "01" indicates that a ZV output is enabled.

In the above, this invention has been described in detail with reference to a specific embodiment. However, it is apparent that various changes or substitutions in this embodiment may be made by those skilled in the art without departing from the scope of this invention.

While the present embodiment has been described on the basis of the so-called PC/AT compatible machines ("PC/AT" is a trademark of IBM Corporation) conforming to the OADG specification, it is apparent that this invention may be implemented in other machines as well (e.g., the PC 98 series of NEC Corp., Macintosh of Apple Computer, Inc. and compatible machines thereof).

In summary, this invention has been disclosed in an exemplary manner and, thus, this invention is not to be limited except as proscribed by the claims.

As described above, it has been made clear that advantages of the Invention include providing an improved information processing apparatus, which accomplishes power-saving of an audio amplifier depending on an activity of each peripheral device having an audio signal output.

What is claimed:

1. An information processing apparatus, including:
   one or more peripheral devices, each having an audio signal output and a mute signal output, the mute signal output indicating a mute state in which each of the peripheral devices does not output an audio signal;
   an audio amplifier for receiving the audio signal from each of the one or more peripheral devices;
   a speaker for generating an audible output in accordance with an output of the audio amplifier; and
   an AND gate for receiving the mute signal from each of the one or more peripheral devices to perform a logical AND operation of the mute signals, the AND gate outputting a control signal for disabling the audio amplifier when all of the mute signals indicate the mute state.

2. The information processing apparatus as set forth in claim 1, wherein one of the peripheral devices is a modem.

3. The information processing apparatus as set forth in claim 1, wherein one of the peripheral devices is a CD-ROM drive.

4. The information processing apparatus as set forth in claim 1, wherein one of the peripheral devices is an,audio controller.

5. The information processing apparatus as set forth in claim 1, wherein one of the peripheral devices is a beep generator.

6. The information processing apparatus as set forth in claim 1, wherein one of the peripheral devices is a ZV port compatible PCMCIA card slot.

7. A power saving apparatus for an audio amplifier adapted for use in an information processing apparatus of the type which has one or more peripheral devices each for outputting an audio signal for generation of an audible output by the audio amplifier and a speaker, comprising:

means for receiving a mute signal from each of the one or more peripheral devices, the mute signal indicating a mute state in which each of the peripheral devices does not output an audio signal; and means for performing a logical AND operation of the received mute signals, and for outputting a control signal to disable the audio amplifier when only mute signals are received from the peripheral devices indicating that all peripheral devices are in the mute state.

8. The power saving apparatus as set forth in claim 7, wherein one of the peripheral devices is a modem.

9. The power saving apparatus as set forth in claim 7, wherein one of the peripheral devices is a CD-ROM drive.

10. The power saving apparatus as set forth in claim 7, wherein one of the peripheral devices is an audio controller.

11. The power saving apparatus as set forth in claim 7, wherein one of the peripheral devices is a beep generator.

12. The power saving apparatus as set forth in claim 7, wherein one of the peripheral devices is a ZV port compatible PCMCIA card slot.

* * * * *